United States Patent

Sakamoto et al.

[15] 3,652,960

[45] Mar. 28, 1972

[54] VARIABLE CAPACITANCE DIODE FREQUENCY SELECTOR UTILIZING A PLURALITY OF FLIP-FLOPS

[72] Inventors: Yoichi Sakamoto, Toyonaka; Eisuke Ichinohe, Osaka, both of Japan

[22] Filed: May 13, 1970

[21] Appl. No.: 36,921

[30] Foreign Application Priority Data

May 20, 1969 Japan ....................................44/40064
May 20, 1969 Japan ....................................44/40065
May 20, 1969 Japan ....................................44/40066

[52] U.S. Cl. ....................................334/15, 307/223, 325/455, 325/464, 325/468

[51] Int. Cl. ....................................H03h 5/12

[58] Field of Search ....................................334/15; 325/455, 464, 468

[56] References Cited

UNITED STATES PATENTS

| | | | |
|---|---|---|---|
| 3,518,586 | 6/1970 | Nilssen et al. | 334/15 X |
| 3,495,195 | 2/1970 | Ribour | 334/15 |
| 3,503,018 | 3/1970 | Cavanaugh | 334/15 |

*Primary Examiner*—Herman Karl Saalbach
*Assistant Examiner*—Paul L. Gensler
*Attorney*—Stevens, Davis, Miller & Mosher

[57] ABSTRACT

A tuning system for selecting, for instance, stations or broadcasting television channels, wherein the tuning can be made totally electronically by impressing the output of a digitally controlled voltage generator upon variable capacitance coupled elements and the component parts are reduced in number to facilitate integration of the circuit of the system.

4 Claims, 3 Drawing Figures

Y. SAKAMOTO AND
E. ICHINOHE
INVENTORS

BY Stevens, Davis, Miller & Mosher
ATTORNEYS

VARIABLE CAPACITANCE DIODE FREQUENCY SELECTOR UTILIZING A PLURALITY OF FLIP-FLOPS

The invention relates to tuning systems for selecting television stations or channels using variable capacitance diodes as the tuning elements of the television tuner, wherein reverse voltages to be impressed across the variable capacitance diodes are selected and memorized through an electronic circuit.

Figure 1:
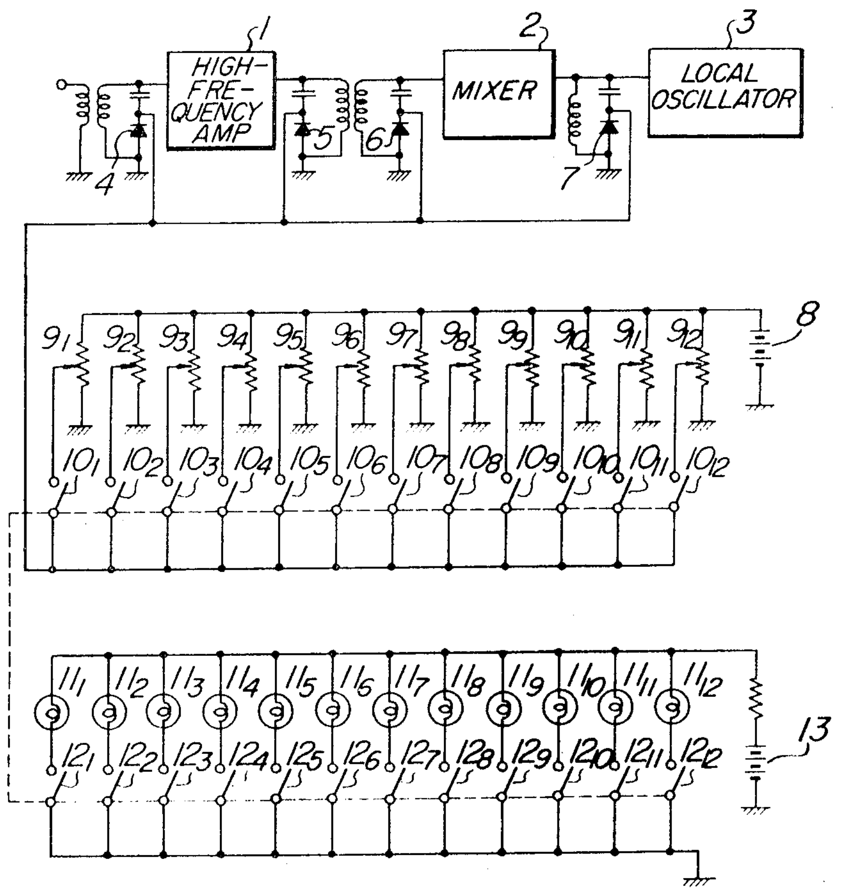
FIG. 1 PRIOR ART
FIG. 1 is a schematic circuit diagram of an example of the conventional tuning system.

A typical example of the usual tuning system for selecting television channels is shown in FIG. 1. It comprises a high-frequency amplifier 1, a mixer 2, a local oscillator 3, an input resonance variable capacitor diode 4, intermediate stage resonance variable capacitance diodes 5 and 6, and a local oscillation variable capacitance diode 7. The voltage of a control power supply 8 is divided by variable resistors $9_1$ to $9_{12}$ for impression through switches $10_1$ to $10_{12}$ upon the capacitance diodes 4 to 7. The variable resistors $9_1$ to $9_{12}$ are preset to give respective voltage ratios so as to supply voltages appropriate for selecting desired channels. When one of switches $10_1$ to $10_{12}$, which corresponds to a given channel to be selected, is closed, preset voltages appear across the capacitance diodes 4 to 7 to effect tuning to a desired channel. The selected channel is indicated by a corresponding one of pilot lamps $11_1$ to $11_{12}$, as the corresponding pilot lamp makes a closed circuit with a power supply 13 when a corresponding switch in a group of switches $12_1$ to $12_{12}$ is closed in association with the action of the corresponding switch among the switches $10_1$ to $10_{12}$.

In the above construction of the conventional turning system, despite the contactless tuner proper using the capacitance diodes as the tuning elements, the switches $10_1$ to $10_{12}$ as well as the switches $12_1$ to $12_{12}$ involve the mechanical action of make-and-break contacts for impressing the divided voltages across the variable capacitance diodes, so that the merit of the tuner which enables the channels to function absolutely electrically cannot be fully displayed so as not to achieve the object of realizing a contactless tuning system for selecting television channels.

An object of the invention is to provide a tuning system, which can overcome the foregoing drawbacks.

Figure 2:
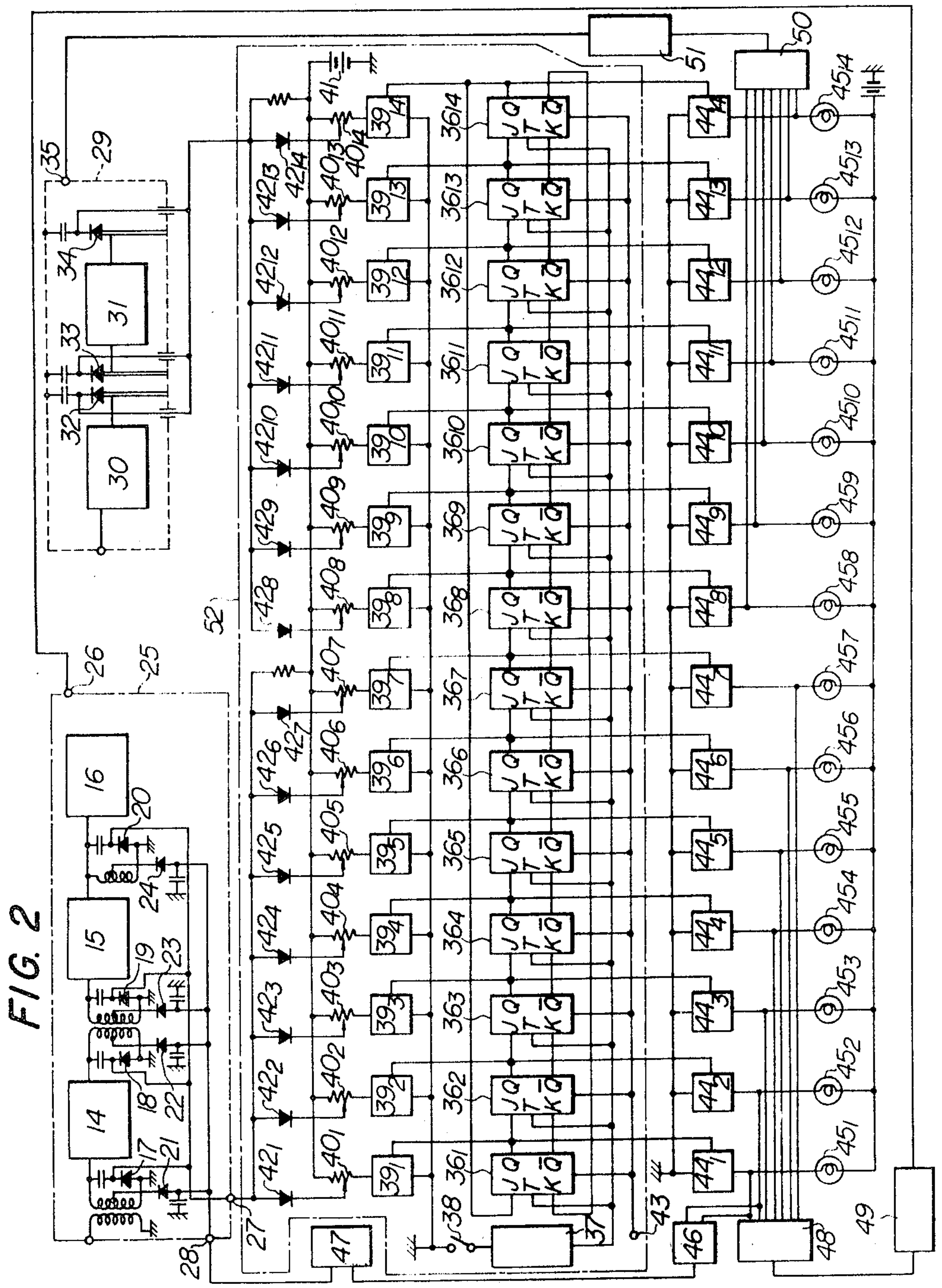
FIG. 2 is a schematic circuit diagram of an embodiment of the tuning system according to the invention.

The invention will now be described in conjunction with a preferred embodiment thereof with reference to the accompanying drawings. Referring now to FIG. 2, where parts 14 to 20 correspond to the respective parts 1 to 7 in the conventional system of FIG. 1, diodes 21 to 24 are triggered or cut off for grounding or de-grounding the intermediate taps of the resonance coils of the input stage, intermediate stage and oscillator circuits from the high-frequency standpoint. Thus, with the diodes 21 to 24, switching between the higher and lower regions of the VHF band for television broadcasting is achieved. The portion enclosed within a closed dashed line 25 constitutes a VHF tuner circuit having a terminal 26 connected to a power supply, a terminal 27 for impression of voltage across variable capacitance diodes and a terminal 28 connected to a power supply, which provides a positive or negative voltage for the switching between the higher and lower VHF band regions. The portion enclosed within a closed dashed line 29 constitutes a UHF tuner circuit comprising a high-frequency amplifier 30, a self-oscillating mixer 31, interstage resonance variable capacitance diodes 32 and 33 and a local oscillation variable capacitance diode 34. A terminal 35 is connected to a power supply feeding the UHF tuner 29.

Flip-flops $36_1$ to $36_{14}$ constitutes a ring counter, whose pattern is shifted by shift pulses generated by a shift pulse generator 37. The shift pulse generator is rendered operative by closing a switch 38. The pattern of the ring counter is [10000000000000, if the flip-flop $36_1$ is in the state [1] while the other flip-flops are in the state [0]. When the shift pulse generator 37 generates a first pulse, the pattern of the ring counter is shifted to [01000000000000], and with successive shift pulses the position of [1] in the pattern is successively shifted.

Switch circuits $39_1$ to $39_{14}$ respectively connected to the output side of the flip-flops $36_1$ to $36_{14}$ are selectively closed when a corresponding flip-flop gets into the state [1] to cause current through an associated resistor among resistors $40_1$ to $40_{14}$. At this time, no current is caused through the other resistors. By so arranging that the resistor $40_1$ is tapped for connection to a diode $42_1$ to divide the voltage of a power supply 41 so as to provide a required voltage, a voltage substantially equal to the voltage across a division of the resistor $40_1$ appears at a terminal 27. This is because there is no current through the resistors $40_2$ to $40_{14}$ and diodes $42_2$ to $42_{14}$ are off since the negative pole of the diodes $42_2$ to $42_{14}$ is held at a potential equal to the voltage of the power supply 41 and higher than the potential at the positive pole, i.e., the voltage across the division of the resistor $40_1$. Thus, by appropriately adjusting or designing the voltage ratio for the individual resistors $40_1$ to $40_{14}$ associated to the respective flip-flops $36_1$ to $36_{14}$ to respective required values, preset voltages may be obtained as the output when the flip-flops successively get into the state [1] as the pattern of the ring counter is changed from the initial state [10000000000000] by closing the switch 38 to cause the shift pulse generator 37 to generate successive shift pulses for impression upon the ring counter. When a required voltage is obtained, the switch is opened to stop the generation of shift pulses. Numeral 43 designates a reset pulse terminal which supplies a reset signal to flip-flops $36_1$ to $36_{14}$ to return the flip-flops to their initial state.

As is described, the voltage ratio for the resistors $40_1$ to $40_{14}$ is preset such that voltages appropriate for reception of respective channels are produced, and one of these voltages, which corresponds to a desired channel, may be selected by the foregoing circuit for inverse impression on the variable capacitance diodes 17 to 20 serving as the tuning elements of the tuner, which thus selects the desired channel. When one of the flip-flops $36_1$ to $36_{14}$ of the ring counter assumes the [1] state, a corresponding switch circuit $44_1$ to $44_{14}$ is closed to cause current to pass through a corresponding pilot lamp $44_1$ to $45_{14}$ so as to indicate the channel being received. Also, in place of the pilot lamp other indicating means such as numerical indicator tubes may be used as well.

An OR-circuit 46 produces output to render a switch circuit 47 operative during the reception of one of channels in the lower region of the VHF band, the channels 1 to 3 in Japan. During this time, the output of the switch circuit 47 cuts off diodes 21 to 24 of the VHF tuner circuit 25 to separate the intermediate taps of the resonance coils from the ground from the high-frequency standpoint, thereby enabling the reception of a channel in the lower VHF band region. During the reception of a channel in the higher VHF band region, the output of the switch circuit 47 holds the diodes 21 to 24 triggered to ground the intermediate taps of the resonance coils from the high-frequency standpoint, thereby enabling the reception of a channel in the higher VHF band region.

During the reception of the VHF band, an OR-circuit 48 produces output at a certain level to render a switch circuit 49 operative, thus connecting the tuner power supply to the VHF tuner circuit. On the other hand, during the reception of the UHF band the tuner power supply is connected to the UHF tuner circuit through an OR-circuit 50 and a switch circuit 51.

From the foregoing, it will be seen that the tuning system of the above construction can start the tuning operation by closing the switch 38 and stop the tuning operation to memorize the channel tuned by opening the switch 38.

Although in the foregoing embodiment there are involved 7 UHF band channels and 7 VHF band channels, the number of channels may of course be increased or decreased.

Figure 3:
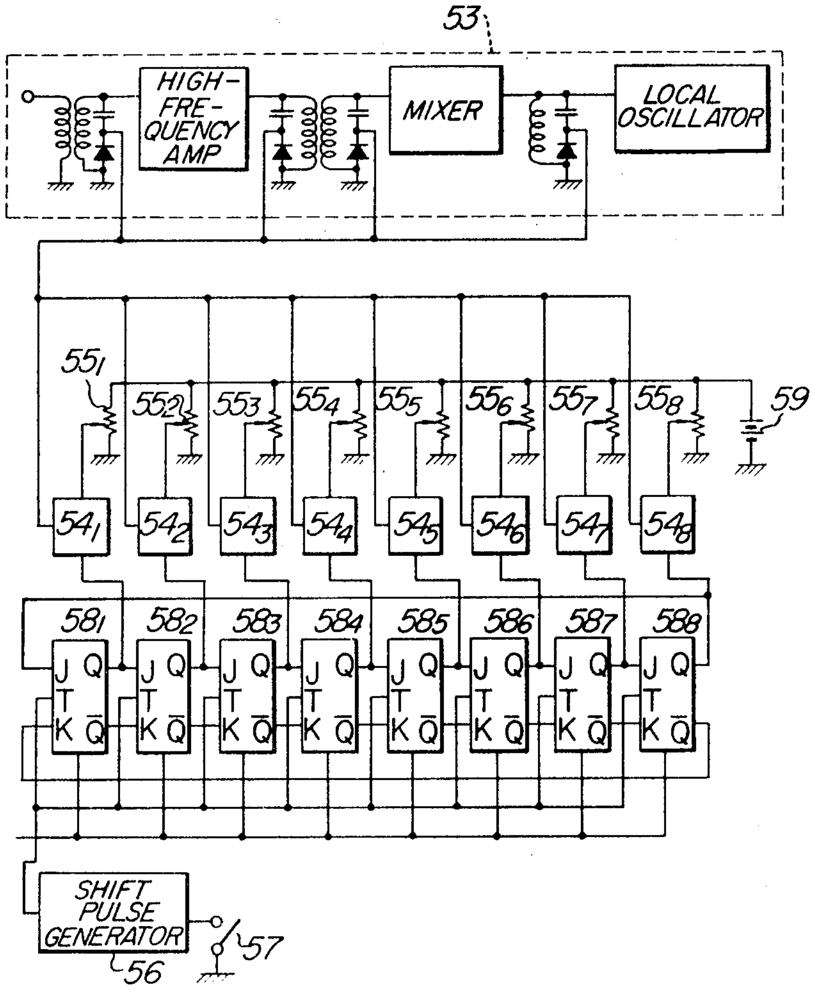
FIG. 3 is a schematic circuit diagram of a tuning circuit similar to but partly different from the tuning system of FIG. 1 embodying the invention.

FIG. 3 shows another embodiment of the tuning system, which is similar to the previous embodiment except for part 52 of FIG. 2. In this embodiment, only the VHF tuner circuit is provided for the sake of simplifying the description. It comprises voltage presetting resistors $55_1$ to $55_8$, a shift pulse generator 56, a switch 57, flip-flops $58_1$ to $58_8$ constituting a ring counter, switch circuits $54_1$ to $54_8$ connecting selectively the resistors $55_1$ to $55_8$ and the VHF tuner 53 by the signal from the appropriate flip-flop $58_1$ to $58_8$ being in the [1] state, and a power supply 59. The operation of this embodiment is principally the same as that of the previous embodiment of FIG. 2. In this embodiment, the combination of the ring counter and gates $54_1$ to $54_8$ replaces the combination of the ring counter and diodes as in the embodiment of FIG. 2 for obtaining a voltage corresponding to the pattern of the ring counter at the output terminal.

As has been described in the foregoing, according to the invention the role heretofore performed by mechanical contacts can be achieved absolutely through electronic circuits outstandingly improving the reliability of not only the tuner itself, but also the entire tuning system, which has conventionally used many mechanical contacts for selectively impressing a required voltage on the variable capacitance diodes and for both switching between the higher and lower regions of the VHF band and switching of the tuner power supply between the VHF and UHF tuners despite the contactless tuner, which has been realized by using the variable capacitance diode as the tuning elements.

Also, as the voltage ratio of the voltage dividing resistors is preset, these resistors can be formed by the base diffusion in a semiconductor integrated circuit to reduce the size of the system, which is a great advantage in economy. Of course, other integrated circuits than the semiconductor integrated circuit may be employed. Recent advances in integrated circuit technique and the associated cost reduction have been remarkable, and there are a variety of possibilities of adopting the technique in domestic apparatus. In domestic apparatus, particularly in television sets, the reduction of manufacturing costs is one of the most important factors. In this respect, cost reduction through integration of the system into an integrated circuit, particularly one having a high integration degree, is far greater as compared to the cost reduction attainable with a system having mechanical contacts.

Further, the selection of channels can be accomplished through remote control by merely transmitting signals to actuate the switch for the shift pulse generator. This switch itself can be readily replaced by an electronic circuit. Also, motors and relays are never used, which is an advantage from the standpoint of cost.

Furthermore, the speed of tuning may be outstandingly improved as compared to the manual tuning operation, so that the tuning system can have various new functions in addition to the function of the conventional television tuner promising various applications.

Moreover, the voltage on the input side of the switch circuit may be low and the source voltage on the load side may be high, so that even when the power supply for the ring counter and the shift pulse generator provides a low voltage a high output voltage can be produced, which is advantageous in case an output voltage higher than the voltage of a power supply for the ordinal logic circuit is required.

What is claimed is:

1. A tuning system for selecting channels, comprising a ring counter having a plurality of flip-flops, load circuits respectively associating with said flip-flops and first, variable capacitance, diodes providing resonant capacitances to effect tuning to predetermined frequencies, wherein any one of said flip-flops assumes the state of "1" and the "1" state is successively shifted from one to the next one of said flip-flops as successive shift pulses are fed to said ring counter, so that one of said load circuits associating with the state "1" flip-flop provides a predetermined voltage for reverse impression on said variable capacitance coupled diodes.

2. The tuning system according to claim 1, wherein said system is adapted to select a desired channel in VHF and UHF bands and further comprises switch circuits each connected to the output side of a corresponding one of said flip-flops, an indicating means selectively driven by one of said switch circuits connected to the state "1" flip-flop to indicate a channel selected, a first OR circuit with an associated switch circuit for switching between the higher and lower VHF band regions, said first OR circuit being connected to the output side of flip-flops in said ring counter corresponding to channels in the VHF band, and a second OR circuit with an associated switch circuit for switching a tuner power supply to the UHF band upon the detection of the state "1" in any one of the flip-flops in said ring counter corresponding to the UHF band channel.

3. The tuning system according to claim 1, wherein said load circuits comprise respective resistors individually tapped for connection to respective second diodes, so that current may be caused to flow only through the resistor among said resistors that is associated with the state "1" flip-flop to take out a predetermined voltage through the tap of the current-carrying resistor via a connection point commonly connected to said diodes on the side opposite the taps of said resistors.

4. A tuning system for selecting one of a plurality of predetermined frequencies, comprising: a ring counter, including a plurality of flip-flops, one for each of said plurality of predetermined frequencies; means generating pulse signals to change the state of said flip-flops from a "1" state to a "0" state and vice versa, such that only one flip-flop at a time is in a "1" state; voltage dividing means connected to the outputs of said flip-flops, each of said voltage dividing means having a voltage dividing tap preset for one of said predetermined frequencies; and at least one variable capacitance diode connected to said taps; wherein the divided voltage corresponding to the one flip-flop in the "1" state is applied to said at least one variable capacitance diode for selecting said one of said predetermined frequencies.

* * * * *

PO-1050
(5/69)

UNITED STATES PATENT OFFICE
CERTIFICATE OF CORRECTION

Patent No. 3,652, 960 Dated March 28, 1972

Inventor(s) Yoichi Sakamoto et al

It is certified that error appears in the above-identified patent and that said Letters Patent are hereby corrected as shown below:

On the title page, insert the following:

[73] Assignee: Matsushita Electric Industrial Co., Ltd., Osaka, Japan

Signed and sealed this 31st day of October 1972.

(SEAL)
Attest:

EDWARD M.FLETCHER,JR.
Attesting Officer

ROBERT GOTTSCHALK
Commissioner of Patents